US012648364B2

(12) United States Patent
Nguyen et al.

(10) Patent No.: US 12,648,364 B2
(45) Date of Patent: Jun. 2, 2026

(54) ENCASPULATED MRAM DEVICE WITH WRAP-AROUND TOP ELECTRODE

(71) Applicant: INTERNATIONAL BUSINESS MACHINES CORPORATION, Armonk, NY (US)

(72) Inventors: Son Nguyen, Schenectady, NY (US); Ashim Dutta, Clifton Park, NY (US); Rudy J. Wojtecki, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 510 days.

(21) Appl. No.: 18/186,230

(22) Filed: Mar. 20, 2023

(65) Prior Publication Data

US 2024/0324469 A1    Sep. 26, 2024

(51) Int. Cl.
| | |
|---|---|
| *H10N 50/80* | (2023.01) |
| *H10B 61/00* | (2023.01) |
| *H10N 50/01* | (2023.01) |
| *H10N 50/20* | (2023.01) |

(52) U.S. Cl.
CPC ............. *H10N 50/80* (2023.02); *H10B 61/00* (2023.02); *H10N 50/01* (2023.02); *H10N 50/20* (2023.02)

(58) Field of Classification Search
CPC ........ H10N 50/80; H10N 50/20; H10N 50/10; H10B 61/00
See application file for complete search history.

(56) References Cited

U.S. PATENT DOCUMENTS

| | | | | |
|---|---|---|---|---|
| 10,312,435 | B1 | 6/2019 | Dobisz | |
| 10,468,585 | B1 | 11/2019 | Nguyen | |
| 10,777,411 | B1 | 9/2020 | Nguyen | |
| 10,879,455 | B2 | 12/2020 | Tien | |
| 11,171,054 | B2 | 11/2021 | Nguyen | |
| 11,217,563 | B2 | 1/2022 | Zhai | |
| 11,239,421 | B2 | 2/2022 | Kong | |
| 11,417,832 | B2 | 8/2022 | Yin | |
| 2010/0102407 | A1* | 4/2010 | Kajiyama | H10B 61/22 257/E29.323 |

(Continued)

OTHER PUBLICATIONS

Chen et al., "Fully Self-Aligned Via Integration for Interconnect Scaling Beyond 3nm Node", 2021 IEEE International Electron Devices Meeting IEDM, pp. 22.1.1-22.1.4.

(Continued)

*Primary Examiner* — Shih Tsun A Chou
(74) *Attorney, Agent, or Firm* — Samuel A. Waldbaum

(57) ABSTRACT

A semiconductor device including a magnetic tunnel junction (MTJ) stack, a dielectric encapsulation layer surrounding vertical side surfaces of the MTJ stack, a metal encapsulation layer surrounding an upper horizontal surface and a portion of a vertical side surface of the dielectric encapsulation layer, and a dielectric surrounding a remaining portion of the vertical side surface of the dielectric encapsulation layer. A method including method includes forming a magnetic tunnel junction (MTJ) stack, forming a dielectric encapsulation layer surrounding vertical side surfaces of a top electrode, a free layer, a tunneling barrier, a reference layer and a bottom electrode of the MTJ stack, and forming a metal encapsulation layer surrounding an upper horizontal surface and a portion of a vertical side surface of the dielectric encapsulation layer.

15 Claims, 9 Drawing Sheets

(56)  References Cited

U.S. PATENT DOCUMENTS

| | | | |
|---|---|---|---|
| 2013/0032775 A1* | 2/2013 | Satoh | H10N 70/826 |
| | | | 257/1 |
| 2023/0371275 A1* | 11/2023 | Wang | H10N 50/85 |

OTHER PUBLICATIONS

Nguyen et al., "Selective deposition of AlOx for Fully Aligned Via in nano Cu interconnects", 2021 IEEE International Interconnect Technology Conference (IITC), Jul. 6-9, 2021, pp. 1-2.

Arkles et al., "Understanding ALD, MLD and SAMs as they enter the fab", SolidState Technology, https://sst.semiconductor-digest.com/2018/03/understanding-ald-mld-and-sams-as-they-enter-the-fab/, Accessed on Feb. 27, 2023, 4 pages.

* cited by examiner

ENCASPULATED MRAM DEVICE WITH WRAP-AROUND TOP ELECTRODE

BACKGROUND

The present invention relates, generally, to the field of semiconductor manufacturing, and more particularly to fabricating an encapsulated magnetic tunnel junction device with a wrap-around top electrode structure.

Magneto resistive random-access memory ("MRAM") devices are used as non-volatile computer memory. MRAM data is stored by magnetic storage elements. The elements are formed from two ferromagnetic layers, each of which can hold a magnetic field, separated by a spin conductor layer. One of the two layers is a reference magnet, or a reference layer, set to a particular polarity, while the remaining layer's field can be changed to match that of an external field to store memory and is termed the "free magnet" or "free-layer". This configuration is known as the magnetic tunnel junction (MTJ) and is the simplest structure for a MRAM bit of memory.

SUMMARY

According to an embodiment of the present invention, a semiconductor device is provided. The semiconductor device including a magnetic tunnel junction (MTJ) stack, a dielectric encapsulation layer surrounding vertical side surfaces of the MTJ stack and a metal encapsulation layer surrounding an upper horizontal surface and a portion of a vertical side surface of the dielectric encapsulation layer.

An embodiment where the MTJ stack includes a top electrode on a free layer on a tunneling barrier on a reference layer on a bottom electrode. An embodiment further including an upper metal line for the MTJ stack surrounding vertical side surfaces of the MTJ stack. An embodiment where a lower horizontal surface of an upper word line of the MTJ stack is below a bottom electrode of the MTJ stack. An embodiment further including a dielectric surrounding a remaining portion of the vertical side surface of the dielectric encapsulation layer. An embodiment further including a bottom electrode contact below and electrically connected to the bottom electrode and a lower metal line below and electrically connected to the bottom electrode contact.

According to an embodiment of the present invention, a semiconductor device is provided. The semiconductor device including a magnetic tunnel junction (MTJ) stack, a dielectric encapsulation layer surrounding vertical side surfaces of the MTJ stack, a metal encapsulation layer surrounding an upper horizontal surface and a portion of a vertical side surface of the dielectric encapsulation layer, and a dielectric surrounding a remaining portion of the vertical side surface of the dielectric encapsulation layer.

An embodiment where the MTJ stack includes a top electrode on a free layer on a tunneling barrier on a reference layer on a bottom electrode. An embodiment further including an upper metal line for the MTJ stack surrounding vertical side surfaces of the MTJ stack. An embodiment where a lower horizontal surface of an upper word line of the MTJ stack is below a bottom electrode of the MTJ stack. An embodiment further including a bottom electrode contact below and electrically connected to the bottom electrode, and a lower metal line below and electrically connected to the bottom electrode contact.

According to an embodiment of the present invention, a method is provided. The method including forming a magnetic tunnel junction (MTJ) stack, forming a dielectric encapsulation layer surrounding vertical side surfaces of a top electrode, a free layer, a tunneling barrier, a reference layer and a bottom electrode of the MTJ stack, and forming a metal encapsulation layer surrounding an upper horizontal surface and a portion of a vertical side surface of the dielectric encapsulation layer.

An embodiment further including applying a self-assembly monolayer bonding to an upper horizontal surfaces of the top electrode and a portion of vertical side surfaces of the dielectric encapsulation layer. An embodiment where the MTJ stack includes a top electrode on a free layer on a tunneling barrier on a reference layer on a bottom electrode. An embodiment further including forming a dielectric surrounding a remaining portion of the vertical side surface of the dielectric encapsulation layer. An embodiment further including forming a bottom electrode contact below and electrically connected to the bottom electrode, and forming a lower metal line below and electrically connected to the bottom electrode contact. An embodiment further including forming an upper metal line for the MTJ stack surrounding vertical side surfaces of the MTJ stack.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
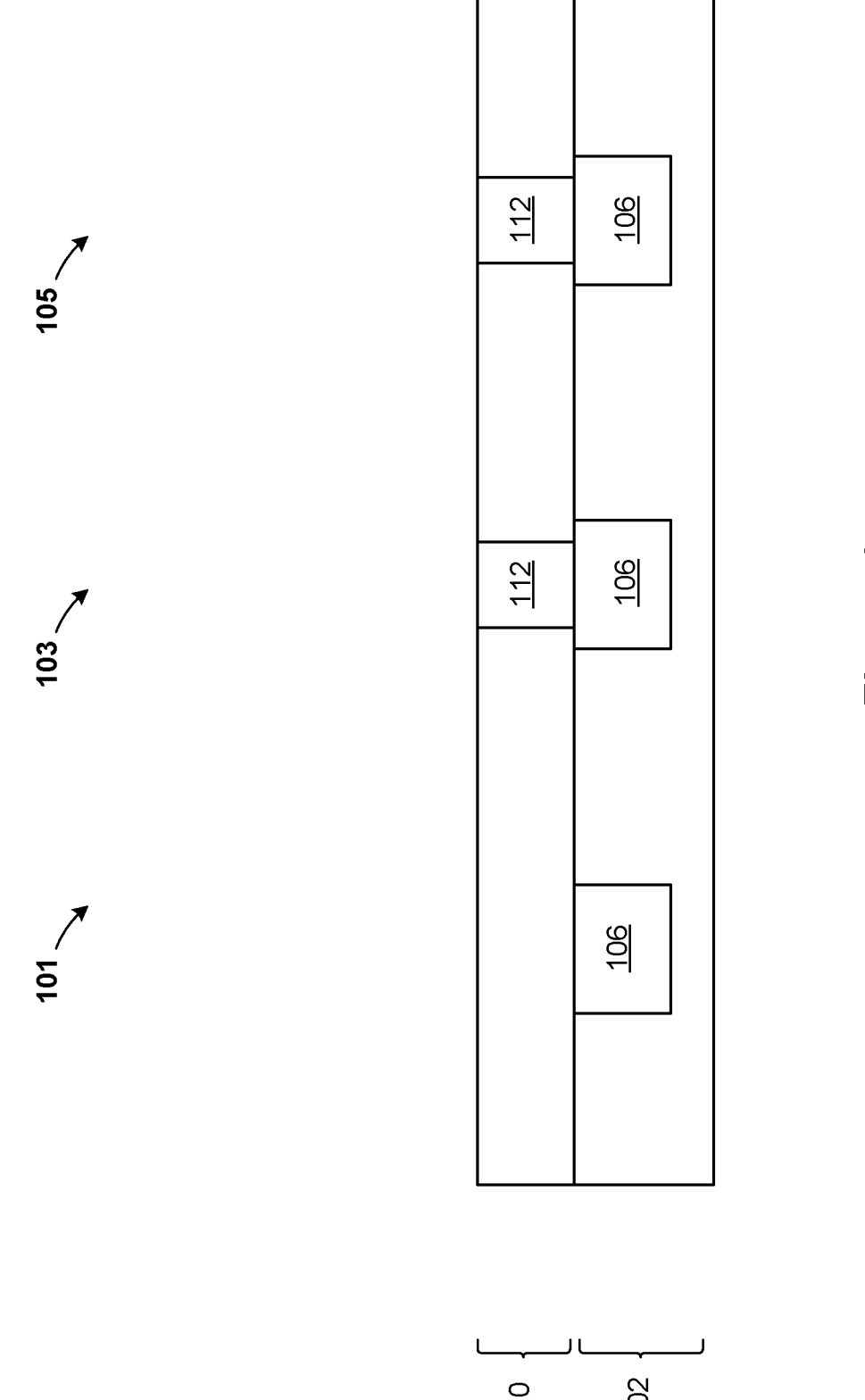
FIG. 1 illustrates a cross-sectional view of a semiconductor structure at an intermediate stage of fabrication, according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

As stated above, magneto resistive random-access memory (hereinafter "MRAM") devices are a non-volatile computer memory technology. MRAM data is stored by magnetic storage elements. The elements are formed from two ferromagnetic layers, each of which can hold a magnetic field, separated by a spin conductor layer. One of the two layers is a reference magnet, or a reference layer, set to a particular polarity, while the remaining layer's field can be changed to match that of an external field to store memory and is termed the "free magnet" or "free-layer". The magnetic reference layer may be referred to as a reference layer, and the remaining layer may be referred to as a free layer. This configuration is known as the magnetic tunnel junction (hereinafter "MTJ") and is the simplest structure for a MRAM bit of memory.

A memory device is built from a grid of such memory cells or bits. In some configurations of MRAM, such as the type further discussed herein, the magnetization of the magnetic reference layer is fixed in one direction (up or down), and the direction of the magnetic free layer can be switched by external forces, such as an external magnetic field or a spin-transfer torque generating charge current. A smaller current (of either polarity) can be used to read resistance of the device, which depends on relative orientations of the magnetizations of the magnetic free layer and the magnetic reference layer. The resistance is typically higher when the magnetizations are anti-parallel and lower when they are parallel, though this can be reversed, depending on materials used in fabrication of the MRAM.

In an embedded MRAM structure, a top contact trench depth has a minimal limited process window due to erosion of a dielectric encapsulation material surround an MRAM pillar during top contact etch. This limits extending a contact to a top electrode of the MRAM pillar due to potential over etch, reducing a reliable top contact connection. In order to limit the over etch, a metal oxide layer is deposited to block etch erosion of the dielectric encapsulation material surrounding the MRAM pillar. The metal oxide is reactive ion etching (RIE) selective, allowing selective removal of materials surrounding the MRAM pillar without damage to the MRAM pillar.

The selective deposition of the metal oxide on the dielectric encapsulation layer blocks etch erosion during subsequent processing steps and functions as an etch stop layer. Additionally, the metal sidewall etch stop layer allows a deeper trench depth by protecting the dielectric encapsulation layer and the layers of the MTJ cell, and allows subsequent formation of a deeper contact to the top electrode depth which surrounds the MTJ cell. This is beneficial in limited spacing of MRAM pillars for narrow intermetal dielectric spacing in advanced logic backend nodes.

This invention provides a structure for forming an embedded MRAM device where partial selective metal oxide, or metal oxide encapsulation layer, is present above an upper horizontal surface and partially along vertical side surfaces of an encapsulation dielectric. The encapsulation dielectric surrounds vertical side surfaces of the MRAM pillar, including vertical side surfaces of a top electrode, a free layer, a tunneling barrier, a reference layer and a bottom electrode. The metal oxide encapsulation layer provides protection during pattering of a top contact to the top electrode of the MRAM pillar. The metal oxide encapsulation layer allows embedding of MRAM pillars with short intermetal spacing of advanced technology nodes, for example spacing of less than 100 nm, and typically as small as 3-40 nm.

This invention provides a structure for a magnetic tunnel junction (MTJ) stack embedded in an upper word line. The invention provides a structure for fabricating a logic pillar memory either alone or integrated, with selective deposition/integration fabrication of an etch stop/protection layer to enhance etch protection fabrication and subsequently improve reliability and device yield of the memory pillar. Additionally, formation of the etch stop layer and passivation layer/structure enhance MRAM memory embedding providing flexibility with improved reliability for advanced logic nodes.

The present invention relates, generally, to the field of semiconductor manufacturing, and more particularly to fabricating an encapsulated magnetic tunnel junction device with a wrap-around top electrode structure.

Referring now to FIG. 1, a semiconductor structure 100 (hereinafter "structure") at an intermediate stage of fabrication is shown according to an exemplary embodiment. FIG. 1 is a cross-sectional view of the structure 100. The structure 100 may be formed or provided. The structure 100 may include a cell 101, a cell 103 and a cell 105. The cells 101, 103, 105 each include, for example, an inter-layer dielectric (hereinafter "ILD") 102, a lower metal line 106 and an inter-layer dielectric (hereinafter "ILD") 110. The cells 103, 105 each include, for example, a bottom electrode contact 112. The cell 101 does not include, for example, the bottom electrode contact 112.

The structure 100 may include several back end of line ("BEOL") layers. In general, the back end of line (BEOL) is the second portion of integrated circuit fabrication where the individual devices (transistors, capacitors, resistors, etc.) are interconnected with wiring on the wafer.

The ILD 102 may be formed by depositing or growing a dielectric material on the BEOL layers, followed by a chemical mechanical polishing (CMP) or etch steps. The ILD 102 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques. In an embodiment, the ILD 102 may include one or more layers. In an embodiment, the ILD 102 may include any dielectric material such as tetraethyl orthosilicate (TEOS), silicon oxide (SiOx), silicon nitride (SiNx), silicon boron carbonitride (SiBCN), NBLoK, a low-k dielectric material (with k<4.0) such as SiCOH, SiCNH and SiCNOH, including but not limited to, silicon oxide, spin-on-glass, a flowable oxide, a high-density plasma oxide, borophosphosilicate glass (BPSG), or any combination thereof or any other suitable dielectric material. NBLoK is a trademark of Applied Materials, Inc.

The lower metal line 106 may be formed by first patterning three or more trenches (not shown) into the ILD 102. In an embodiment, the lower metal line 106 is formed from a conductive material layer which is blanket deposited on top of the structure 100, and directly on an upper horizontal surface of the ILD 102, filling the three or more trenches (not shown). The conductive material layer may include materials such as, for example copper (Cu), ruthenium (Ru), cobalt (Co), tungsten (W). The conductive material can be formed by for example, chemical vapor deposition (CVD), physical vapor deposition (PVD), and atomic layer deposition (ALD) or a combination thereof. The lower metal line 106 is formed by damascene, or patterned from the conductive material layer, using known patterning and etching techniques. There may be any number of openings in the ILD 102, each filled with the lower metal line 106, on the structure 100.

A planarization process, such as, for example, chemical mechanical polishing (CMP), may be done to remove excess material from an upper horizontal surface of the structure 100 such that upper horizontal surfaces of the lower metal line 106 and the ILD 102 are coplanar. In an embodiment, the lower metal wire 128 may have a thickness ranging from about 10 nm to about 200 nm, although a thickness less than 10 nm and greater than 200 nm may be acceptable.

The ILD 110 may be formed as described for the ILD 102, directly on an upper horizontal surface of the lower metal line 106 and the ILD 102.

The bottom electrode contact 112 may be formed by first patterning two or more via openings (not shown) into the ILD 110, and filling the three or more via openings. In an embodiment, the bottom electrode contact 112 is formed from a conductive material layer which is blanket deposited on top of the structure 100, and directly on an upper horizontal surface of the ILD 110, filling the three or more via openings (not shown). The conductive material layer may include materials such as, for example copper (Cu), ruthenium (Ru), cobalt (Co), tungsten (W). The conductive material can be formed by for example, chemical vapor deposition (CVD), physical vapor deposition (PVD), and atomic layer deposition (ALD) or a combination thereof. The bottom electrode contact 112 is formed by damascene, or patterned from the conductive material layer, using known patterning and etching techniques. There may be any number of via openings in the ILD 110, each filled with the bottom electrode contact 112 on the structure 100.

A planarization process, such as, for example, chemical mechanical polishing (CMP), may be done to remove excess material from an upper horizontal surface of the structure

100 such that upper horizontal surfaces of the bottom electrode contact 112 and the ILD 110 are coplanar. In an embodiment, the bottom electrode contact 112 may have a thickness ranging from about 10 nm to about 50 to 150 nm, although a thickness less than 50 nm and greater than 150 nm may be acceptable.

Figure 2:
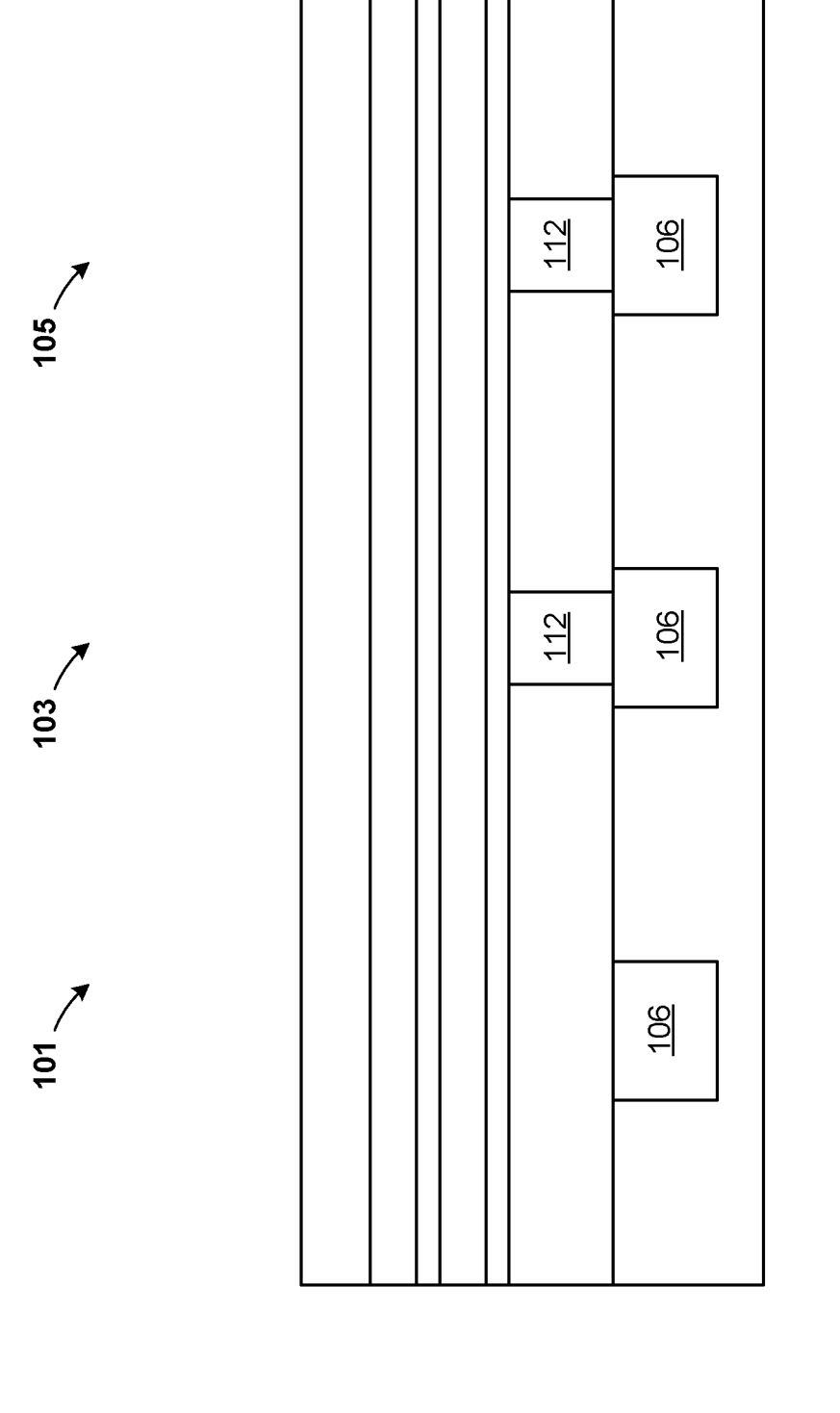
FIG. 2 illustrates a cross-sectional view of the semiconductor structure and illustrates formation of layers of a multi-state memory cell, according to an exemplary embodiment.

Referring now to FIG. 2, a cross-sectional view of the structure 100 is shown, according to an embodiment. A bottom electrode 116 may be formed. A reference layer 118 may be formed. A tunneling barrier 120 may be formed. A free layer 122 may be formed. A top electrode 126 may be formed.

The bottom electrode 116 may be blanket deposited on top of the structure 100, and directly on an upper horizontal surface of the bottom electrode contact 112 and the ILD 110. The conductive material layer of the bottom electrode 116 may include materials such as, for example tantalum nitride (TaN), titanium nitride (TiN), and other common hard mask materials or a combination of them. The conductive material layer may be a conductive film which acts as a bottom electrode and also as a diffusion barrier for the bottom electrode 116. The bottom electrode 116 can be formed by for example, chemical vapor deposition (CVD), physical vapor deposition (PVD), and atomic layer deposition (ALD) or a combination thereof.

A planarization process, such as, for example, chemical mechanical polishing (CMP), may be done to remove excess material from an upper horizontal surface of the structure 100 such that upper horizontal surfaces of the bottom electrode 116 are coplanar.

The reference layer 118 may be formed conformally on the structure 100, on an upper horizontal surface of the bottom electrode 116. The tunneling barrier 120 may be formed conformally on an upper horizontal surface of the reference layer 118. The free layer 122 may be formed conformally on an upper horizontal surface of the tunneling barrier 120.

The top electrode 126 is formed from a conductive material layer which is blanket deposited on top of the structure 100, and directly on an upper horizontal surface of the free layer 122. The top electrode 126 may be composed of, for example, niobium (Nb), niobium nitride (NbN), tungsten (W), tungsten nitride (WN), tantalum (Ta), tantalum nitride (TaN), titanium (Ti), titanium nitride (TiN), ruthenium (Ru), molybdenum (Mo), chromium (Cr), vanadium (V), palladium (Pd), platinum (Pt), rhodium (Rh), scandium (Sc), aluminum (Al) and other high melting point metals or conductive metal nitrides, or a combination thereof. The top electrode 126 may be deposited utilizing a conventional deposition process such as, for example, CVD, plasma enhanced chemical vapor deposition (PECVD), PVD or ALD. The top electrode may have a thickness ranging from about 10 nm to about 100 nm, although a thickness less than 10 nm and greater than 100 nm may be acceptable.

Figure 3:
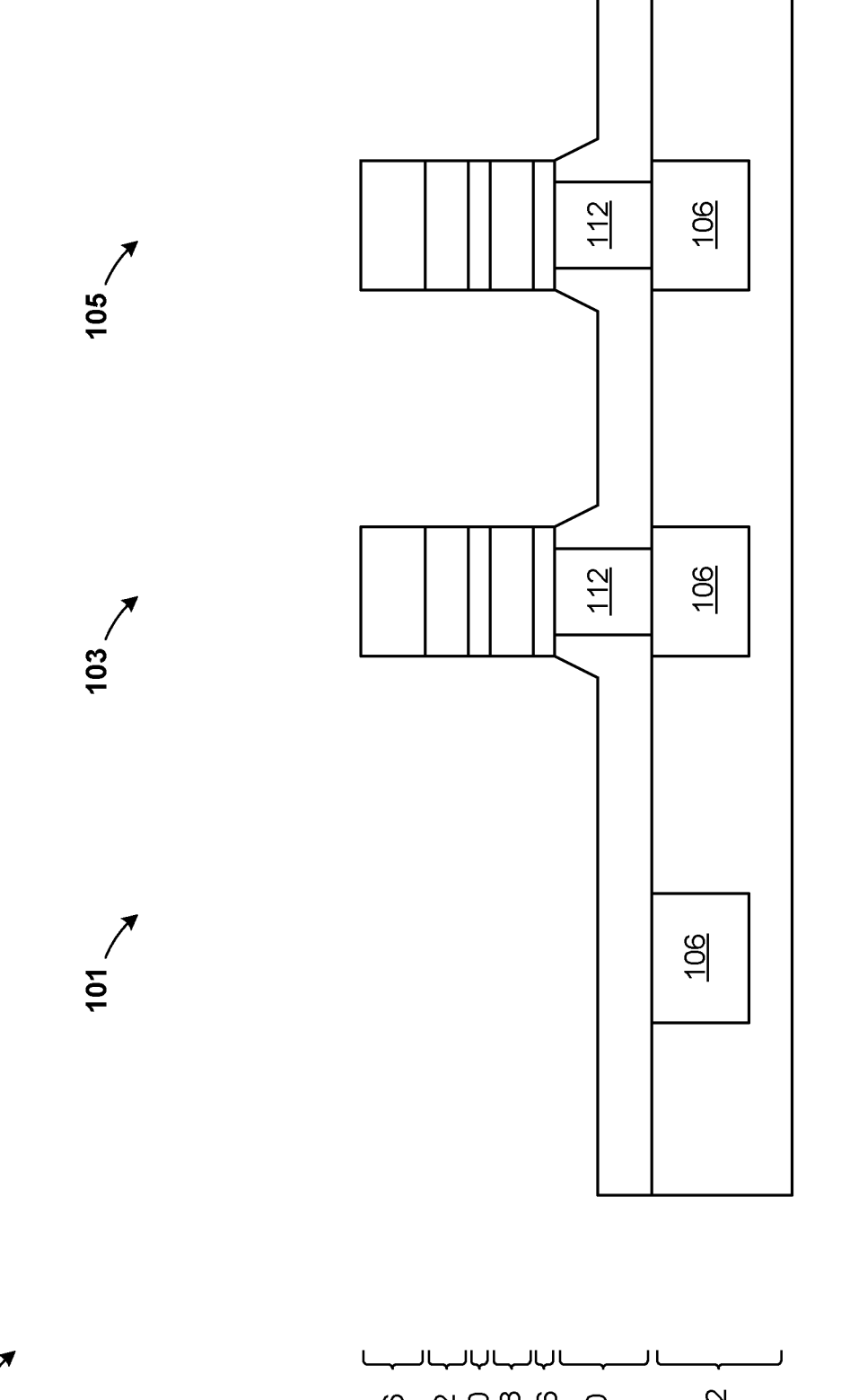
FIG. 3 illustrates a cross-sectional view of the semiconductor structure and illustrates separation into an individual multi-state memory cell, according to an exemplary embodiment.

Referring now to FIG. 3, a cross-sectional view of the structure 100 is shown, according to an embodiment. Patterning may be done to separate the cells 101, 103, 105.

Lithography and patterning may be performed by methods known in the arts, including, for example, forming an organic patterning layer (not shown) and a hard mask (not shown). Selective removal of portions of layers of the structure 100 may be done using a combination of reactive ion etching (RIE) and ion beam etching (IBE). The hard mask (not shown) and the organic patterning layer (not shown) may be removed after patterning.

Vertically aligned portions of the top electrode 126, the free layer 122, the tunneling barrier 120, the reference layer 118, and the bottom electrode 116 may be removed. Portions of the ILD 110 may be removed. Remaining portions of the top electrode 126, the free layer 122, the tunneling barrier 120, the reference layer 118, and the bottom electrode 116 may each remain vertically aligned above the bottom electrode contact 112 and the lower metal line 106. The vertically aligned layers of the top electrode 126, the free layer 122, the tunneling barrier 120, the reference layer 118, and the bottom electrode 116, each form a memory pillar for an MRAM structure in the cells 103, 105. The top electrode 126, the free layer 122, the tunneling barrier 120, the reference layer 118, and the bottom electrode 116, and portions of the ILD 110 may be removed in the cell 101. The cell 101 does not contain an MRAM structure.

Portions of the ILD 110 may be removed. Remaining portions of the ILD 110 may surround the bottom electrode contact 112. Remaining portions of the ILD 110 may cover a horizontal upper horizontal surface of the ILD 102 and the lower metal line 106. The ILD 110 may have a vertical side surface surrounding the bottom electrode contact 112 which is slanted such that it slopes away from an upper horizontal surface of the bottom electrode contact 112, in the cells 103, 105. A height of the ILD 110 above the ILD 102 in the cell 101 may be less than a height of the ILD 110 between the cells 103, 105.

Figure 4:
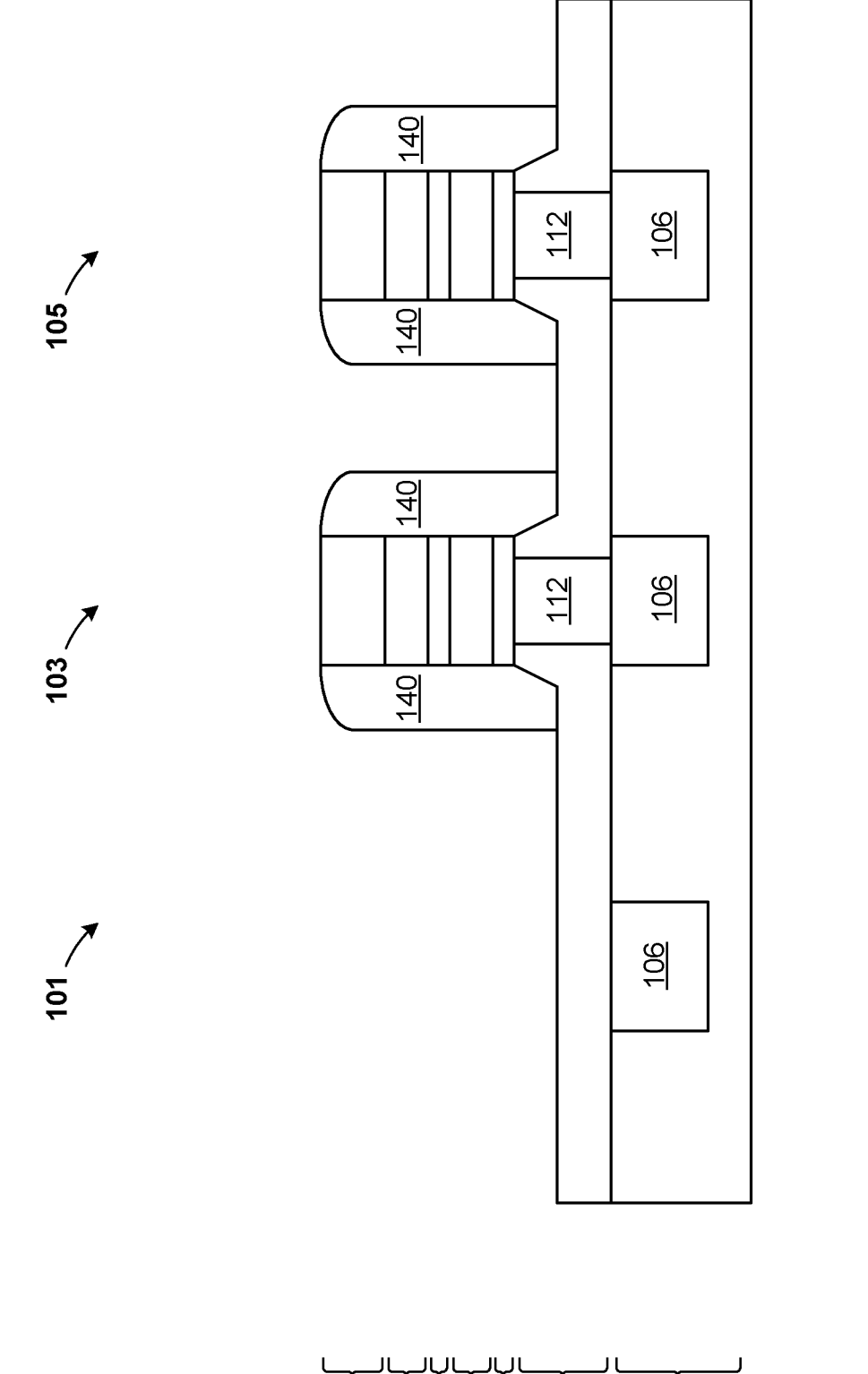
FIG. 4 illustrates a cross-sectional view of the semiconductor structure and illustrates formation of a dielectric encapsulation layer, according to an exemplary embodiment.

Referring now to FIG. 4, a cross-sectional view of the structure 100 is shown, according to an embodiment. A dielectric encapsulation layer 140 may be formed on the structure 100.

The dielectric encapsulation layer 140 may be conformally formed on the structure 100, on an upper horizontal surface of the ILD 110, on an upper horizontal surface and vertical side surfaces of the top electrode 126 and on vertical side surfaces of the free layer 122, the tunneling barrier 120, the reference layer 118 and the bottom electrode 116. The dielectric encapsulation layer 140 may include materials such as, for example, any dielectric material such as silicon nitride (SiN) and silicon nitride carbon (SiNC) and may include a single layer or may include multiple layers of dielectric material. In an alternate embodiment, the metallic cap layer 140 may include zirconium oxide ($ZrO_2$). The dielectric encapsulation layer 140 may be deposited using typical deposition techniques, for example, physical vapor deposition, atomic layer deposition, molecular layer deposition, and chemical vapor deposition. The dielectric encapsulation layer 140 may have a thickness between 3 nm and 30 nm, although thickness greater than 30 nm or less than 3 nm are acceptable.

The dielectric encapsulation layer 140 helps to protect top electrode 126, the free layer 122, the tunneling barrier 120, the reference layer 118, and the bottom electrode 116 from being damaged or oxidized during subsequent processing steps.

Portions of the dielectric encapsulation layer 140 may be selectively removed using an anisotropic etching technique, such as, for example, reactive ion etching. The remaining portions of the dielectric encapsulation layer 140 may remain vertically aligned directly adjacent top electrode 126, the free layer 122, the tunneling barrier 120, the reference layer 118, and the bottom electrode 116 and portions of the ILD 110 surrounding the bottom electrode contact 112, in the cells 103, 105. The dielectric encapsulation layer 140 may be removed from an upper horizontal portions of the top electrode 126 and from a portion of the upper horizontal surfaces of the ILD 110. The dielectric encapsulation layer 140 may be removed in the cell 101.

Figure 5:
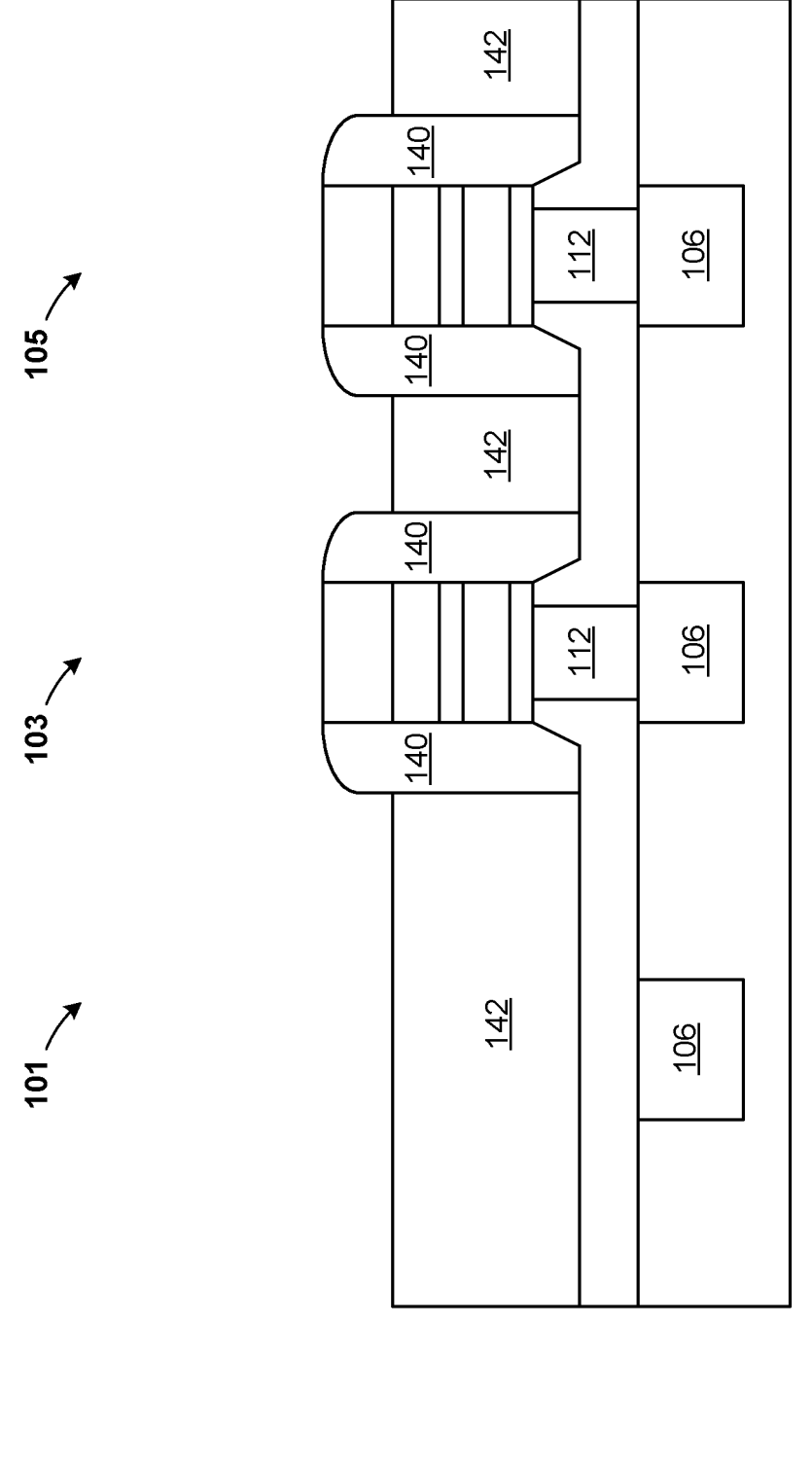
FIG. 5 illustrates a cross-sectional view of the semiconductor structure and illustrates formation of an organic planarization layer, according to an exemplary embodiment.

Referring now to FIG. 5, a cross-sectional view of the structure 100 is shown, according to an embodiment. An organic planarization layer 142 (hereinafter "OPL") may be formed. Self-assembly monolayer/molecules (SAM) may be applied to the structure 100.

The OPL 142 may be formed by a blanket deposition using typical deposition techniques, for example spin-on coating. The OPL 142 can be a self-planarizing organic material that includes carbon, hydrogen, oxygen, and optionally nitrogen, fluorine, and silicon. The OPL 142 can be a standard $C_xH_y$ polymer. Non-limiting examples of materials include, but are not limited to, CHM701B, commercially available from Cheil Chemical Co., Ltd., HM8006 and HM8014, commercially available from JSR Corporation, and ODL-102 or ODL-401, commercially available from ShinEtsu Chemical, Co., Ltd.

A lithograph patterning and dry etch technique may be used to selectively remove a portion of the OPL 142. A lower horizontal surface of the OPL 142 may be lower than upper horizontal surfaces of the top electrode 126 and the dielectric encapsulation layer 140.

The structure 100 may be exposed to an application of SAM to enable selective dielectric deposition encapsulation. SAM is self-assembly monolayer/molecules which are deposited on the structure 100 by a vapor deposition process and is activated with H2 plasma. Material used for SAM may include AlOx, ZnOx, HfOx, among other materials. The SAM provides selective metal oxide deposition and enables selective metal oxide deposition on exposed surfaces of the dielectric encapsulation layer 140, including an upper horizontal surface and a vertical side surface of the dielectric encapsulation layer 140. A small amount of the metal oxide may diffuse onto an upper horizontal surface of OPL 142 and will be removed by subsequent removal of the OPL 142. The metal oxide may diffuse onto the top electrode 126.

The selective deposition of the metal oxide on the dielectric encapsulation layer 140 blocks etch erosion during subsequent processing steps and functions as an etch stop layer. Additionally, the metal sidewall etch stop layer allows a deeper trench depth by protecting the dielectric encapsulation layer 140 and the layers of the MTJ cell, and allows subsequent formation of a deeper contact to the top electrode 126 depth which surrounds the MTJ cell. This is beneficial in limited spacing of MRAM pillars for narrow intermetal dielectric spacing in advanced logic backend nodes.

Figure 6:
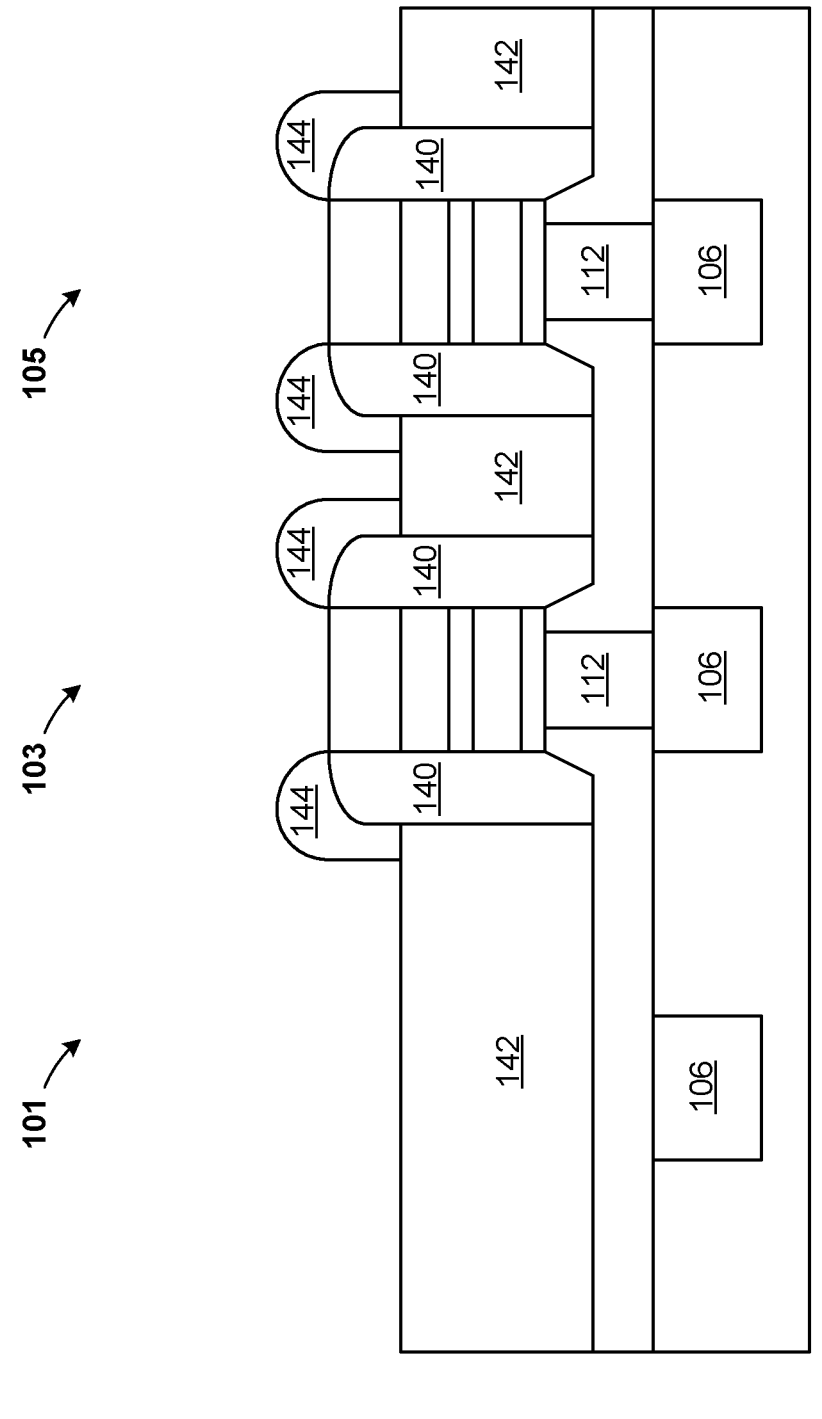
FIG. 6 illustrates a cross-sectional view of the semiconductor structure and illustrates formation of a metal encapsulation layer, according to an exemplary embodiment.
Figure 6:

Referring now to FIG. 6, a cross-sectional view of the structure 100 is shown, according to an embodiment. A metal oxide encapsulation layer 144 may be formed.

The metal oxide encapsulation layer 144 may be formed by selective deposition and may deposit only where the dielectric encapsulation layer 140 is exposed. The metal oxide encapsulation layer 144 will not attach to other layers of the structure 100 due to selective metal deposition which deposits selectively surrounding the dielectric encapsulation layer 140.

The metal oxide encapsulation layer 144 may be deposited on an upper horizontal surface and exposed portions of vertical side surfaces of the dielectric encapsulation layer 140. The metal oxide encapsulation layer 144 may cover a portion of the OPL 142 surrounding the dielectric encapsulation layer 140. The metal oxide encapsulation layer 144 may include aluminum oxide (AlOx), zinc oxide (ZnOx), hafnium (HfOx), an oxide (Ox), or other materials. There is a space between adjacent metal oxide encapsulation layers 144 surrounding the dielectric encapsulation layers 140 between the cells 103, 105.

The purpose of the metal oxide encapsulation layer 144 is to provide protection to the dielectric encapsulation layer 140 during Mx+1 trench patterning and helps to obtain deeper trench depth by embedding the MRAM device within the metal layer.

Figure 7:
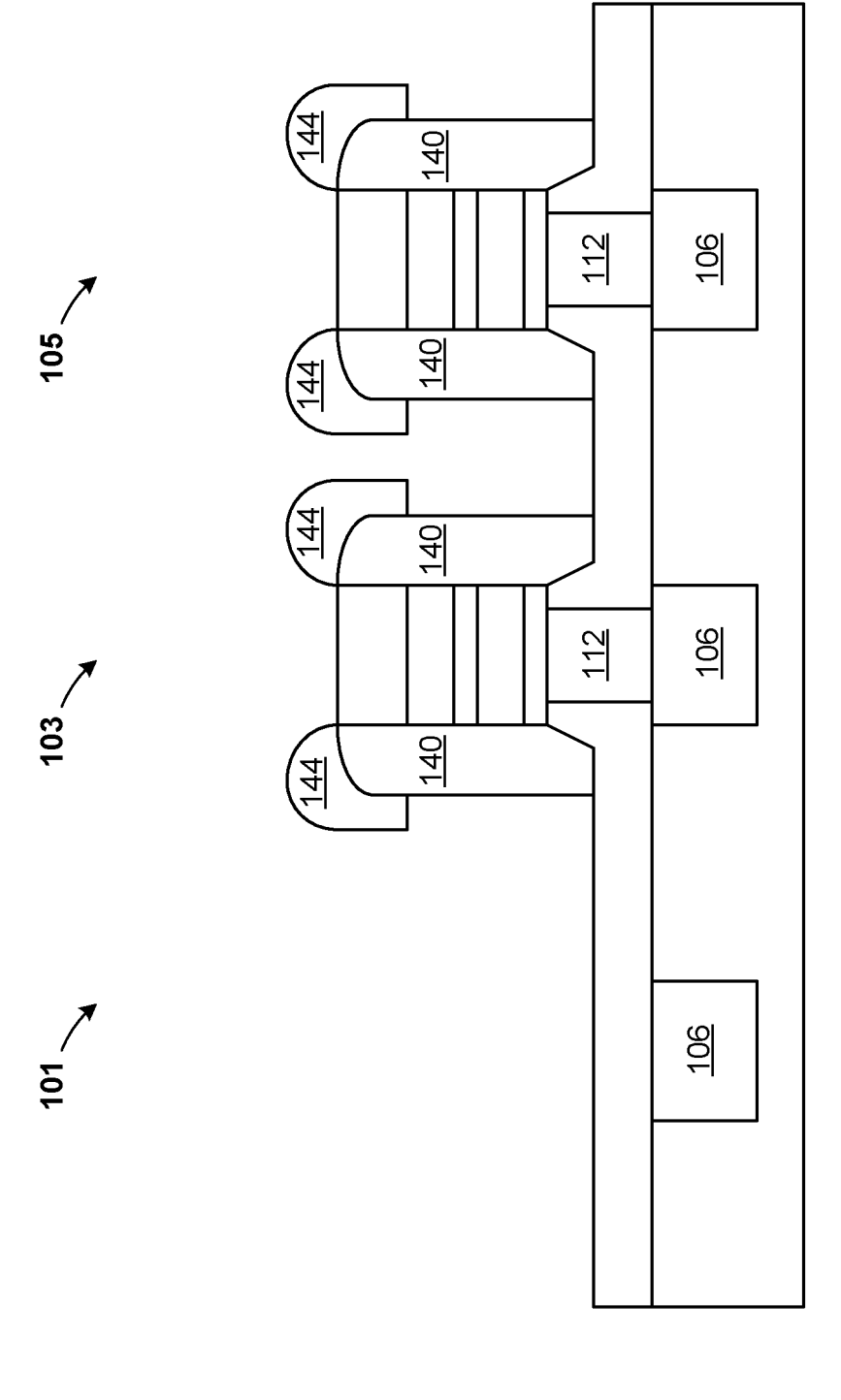
FIG. 7 illustrates a cross-sectional view of the semiconductor structure and illustrates removal of the organic planarization layer, according to an exemplary embodiment.

Referring now to FIG. 7, a cross-sectional view of the structure 100 is shown, according to an embodiment. The OPL 142 may be removed.

The OPL 142 may be selectively removed using known techniques, exposing upper horizontal surfaces of the ILD 110 and the top electrode 126. A vertical side surface and a lower horizontal surface of the dielectric encapsulation layer 140 may be exposed.

Figure 8:
FIG. 8 illustrates a cross-sectional view of the semiconductor structure and illustrates formation of an inter-layer dielectric, according to an exemplary embodiment.

Referring now to FIG. 8, a cross-sectional view of the structure 100 is shown, according to an embodiment. An inter-layer dielectric (hereinafter "ILD") 150 may be formed.

The ILD 150 may be formed as described for the ILD 102, directly on upper horizontal, vertical side surfaces and a lower horizontal surface of the metal oxide encapsulation layer 144, vertical side surfaces of the dielectric encapsulation layer 140 and an upper horizontal surface of the ILD 110. The ILD 150 helps to isolate the cells 103, 105 from each other. A chemical mechanical polishing (CMP) or etch steps may be performed to provide a level upper surface of the ILD 150 for subsequent processing steps.

Figure 9:
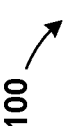
FIG. 9 illustrates a cross-sectional view of the semiconductor structure and illustrates formation of an upper contact, according to an exemplary embodiment.

Referring now to FIG. 9, a cross-sectional view of the structure 100 is shown, according to an embodiment. Portions of the ILD 150 and portions of the ILD 110 may be selectively removed. A contact 156 and a contact 158 may be formed.

The portions of the ILD 150 and the portions of the ILD 110 may be removed using known techniques of dry/wet etch processes.

In the cell 101, vertically aligned portions of the ILD 150 and of the ILD 110 may be removed, exposing an upper horizontal portion of the lower metal line 106. The contact 156 may be formed where the vertically aligned portions of the ILD 150 and of the ILD 110 were removed in the cell 101.

The contact 156 and the contact 158 may each be an upper metal line.

In the cells 103, 105, vertically aligned portions of the ILD 150 may be removed, exposing upper horizontal portions of the ILD 160, and the ILD 130. Vertical side surfaces and upper horizontal surfaces of the metal oxide encapsulation layer 144 may be exposed. The contact 158 may be formed where the vertically aligned portions of the ILD 150 may be removed exposing upper horizontal portions of the ILD 160, and the ILD 130. In an embodiment, the contact 158 is physically and electrically connected to the top electrode 126 of both the cell 103 and the cell 105. In an alternate embodiment, there may be separate contacts 158 to the top electrode 126 in each of the cell 101 and the cell 105.

The metal oxide encapsulation layer 144, the dielectric encapsulation layer 140 and the SAM deposited metal oxide layer on the dielectric encapsulation layer protect the cells 103, 105, during removal of the portions of the ILD 150 and the ILD 110.

The contact 158 may have a lower horizontal surface which is lower, or closer to a substrate of the structure 100, than a lower horizontal surface of the top electrode 126, lower than a lower horizontal surface of the free layer 122 and lower than a lower horizontal surface of the tunneling barrier 120.

The contact 158 wraps around the entire MTJ pillar of the cell 103, 105 surrounding the dielectric encapsulation layer 140 and the metal oxide encapsulation layer 144. This invention enables fitting of a taller MRAM structure into narrow intermetal dielectric spacing, thus extending the usage of MRAM into more advanced node technologies.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device comprising:
   a magnetic tunnel junction (MTJ) stack;
   a dielectric encapsulation layer surrounding vertical side surfaces of the MTJ stack;
   a metal encapsulation layer surrounding an upper horizontal surface of the dielectric encapsulation layer and a portion of a vertical side surface of the dielectric encapsulation layer; and
   a dielectric surrounding a remaining portion of the vertical side surface of the dielectric encapsulation layer.

2. The semiconductor device according to claim 1, wherein
   the MTJ stack comprises a top electrode on a free layer on a tunneling barrier on a reference layer on a bottom electrode.

3. The semiconductor device according to claim 1, further comprising:
   an upper metal line for the MTJ stack surrounding vertical side surfaces of the MTJ stack.

4. The semiconductor device according to claim 3, wherein
   a lower horizontal surface of the upper metal line of the MTJ stack is below a bottom electrode of the MTJ stack.

5. The semiconductor device according to claim 1, further comprising:
   a bottom electrode contact below and electrically connected to the bottom electrode; and
   a lower metal line below and electrically connected to the bottom electrode contact.

6. A semiconductor device comprising:
   a magnetic tunnel junction (MTJ) stack;
   a dielectric encapsulation layer surrounding vertical side surfaces of the MTJ stack;
   a metal encapsulation layer surrounding an upper horizontal surface of the dielectric encapsulation layer and a portion of a vertical side surface of the dielectric encapsulation layer; and
   a dielectric surrounding a remaining portion of the vertical side surface of the dielectric encapsulation layer.

7. The semiconductor device according to claim 6, wherein
   the MTJ stack comprises a top electrode on a free layer on a tunneling barrier on a reference layer on a bottom electrode.

8. The semiconductor device according to claim 6, further comprising:

an upper metal line for the MTJ stack surrounding vertical side surfaces of the MTJ stack.

9. The semiconductor device according to claim 8, wherein a lower horizontal surface of the upper metal line of the MTJ stack is below a bottom electrode of the MTJ stack.

10. The semiconductor device according to claim 8, further comprising:

a bottom electrode contact below and electrically connected to the bottom electrode; and a lower metal line below and electrically connected to the bottom electrode contact.

11. A method comprising:

forming a magnetic tunnel junction (MTJ) stack;

forming a dielectric encapsulation layer surrounding vertical side surfaces of a top electrode, a free layer, a tunneling barrier, a reference layer and a bottom electrode of the MTJ stack;

forming a metal encapsulation layer surrounding an upper horizontal surface and a portion of a vertical side surface of the dielectric encapsulation layer; and forming a dielectric surrounding a remaining portion of the vertical side surface of the dielectric encapsulation layer.

12. The method according to claim 11, further comprising:

applying a self-assembly monolayer bonding to an upper horizontal surfaces of the top electrode and a portion of vertical side surfaces of the dielectric encapsulation layer.

13. The method according to claim 10, wherein the MTJ stack comprises a top electrode on a free layer on a tunneling barrier on a reference layer on a bottom electrode.

14. The method according to claim 11, further comprising:

forming a bottom electrode contact below and electrically connected to the bottom electrode; and forming a lower metal line below and electrically connected to the bottom electrode contact.

15. The method according to claim 11, further comprising:

forming an upper metal line for the MTJ stack surrounding vertical side surfaces of the MTJ stack.

* * * * *